(12) United States Patent
Zheng (10) Patent No.: US 12,068,762 B2
(45) Date of Patent: Aug. 20, 2024

(54) WAVEFORM FILE PROCESSING METHOD, STORAGE MEDIUM, AND DEVICE

(71) Applicants: ARCAS METech. Ltd, Chengdu (CN); ARCAS-TECH Electronic Designautomation, Shanghai (CN)

(72) Inventor: Yibin Zheng, Chengdu (CN)

(73) Assignees: ARCAS METECH LTD, Chengdu (CN); ARCAS-TECH ELECTRONIC DESIGNAUTOMATION, Shanghai (CN)

( * ) Notice: Subject to any disclaimer, the term of this patent is extended or adjusted under 35 U.S.C. 154(b) by 184 days.

(21) Appl. No.: 17/815,320

(22) Filed: Jul. 27, 2022

(65) Prior Publication Data

US 2023/0179226 A1 Jun. 8, 2023

(30) Foreign Application Priority Data

Dec. 2, 2021 (CN) .......................... 202111456118.1

(51) Int. Cl.
*H03M 7/40* (2006.01)
*G06F 16/174* (2019.01)

(52) U.S. Cl.
CPC ...... *H03M 7/4093* (2013.01); *G06F 16/1744* (2019.01)

(58) Field of Classification Search
CPC .......... H03M 7/40; H03M 7/42; H03M 7/425; H03M 13/1111; H03M 13/1134; H03M 13/1137; H03M 13/114; H03M 13/116; H03M 13/6505; H03M 13/6588; H03M 7/30; H03M 7/3077; H03M 7/46;
(Continued)

(56) References Cited

U.S. PATENT DOCUMENTS 5,899,970 A * 5/1999 Sonohara .............. G10L 19/002
704/229
7,116,829 B1 * 10/2006 Boon ................... H04N 19/134
382/248
(Continued)

FOREIGN PATENT DOCUMENTS

CN 103678747 A 3/2014
CN 106156424 A 11/2016
(Continued)

*Primary Examiner* — Linh V Nguyen (74) *Attorney, Agent, or Firm* — Getech Law LLC; Jun Ye (57) ABSTRACT

The present invention discloses a waveform file processing method, storage medium, and device, wherein the method comprises a storage step, and such storage step comprises the following sub-steps: obtain a waveform file that comprises at least one waveform signal; assign a basic index value based on the waveform signal, and adopt the variable-length encoding method to, in a memory, encode the said waveform file as a resolvable serialized structure; when the memory consumed by the serialized structure reaches the threshold, trigger the compression and persistence for the current serialized structure, and obtain the waveform processing file. The present invention uses a unique organization mode to locally or remotely generate a waveform file of a specific format so that the efficiency of subsequent storage, reading, and debugging based on the waveform database file of the said format is significantly improved.

7 Claims, 5 Drawing Sheets

(58) Field of Classification Search
CPC ......... H03M 7/48; H04N 19/13; H04N 19/61;
H04N 19/186; H04N 11/042; H04N
19/10; H04N 19/12; H04N 19/126; H04N
19/134; H04N 19/146; H04N 19/194;
H04N 19/20; H04N 19/30; H04N 19/436;
H04N 19/46; H04N 19/59; H04N 19/60;
H04N 19/63; H04N 19/647; H04N 19/90;
H04N 19/91; H04N 21/234318; H04N
21/2402; H04N 21/26216; H04N 21/2662
USPC .......................................................... 341/67
See application file for complete search history.

(56) References Cited

U.S. PATENT DOCUMENTS

| | | | | |
|---|---|---|---|---|
| 7,899,653 | B2* | 3/2011 | Hollis | G06F 30/367 |
| | | | | 703/2 |
| 2001/0001018 | A1* | 5/2001 | Boon | H03M 7/46 |
| | | | | 375/E7.231 |
| 2004/0069118 | A1* | 4/2004 | Okazaki | G10H 7/12 |
| | | | | 84/603 |
| 2005/0268177 | A1* | 12/2005 | John | G06F 11/3476 |
| | | | | 714/47.1 |
| 2008/0103711 | A1* | 5/2008 | Wegener | G01R 13/029 |
| | | | | 702/66 |
| 2011/0040483 | A1* | 2/2011 | Marshall | G01R 29/0842 |
| | | | | 702/4 |
| 2012/0031256 | A1* | 2/2012 | Tsuchiya | G10H 7/045 |
| | | | | 84/604 |
| 2020/0195918 | A1* | 6/2020 | Hosokawa | H04N 19/172 |

FOREIGN PATENT DOCUMENTS

| | | |
|---|---|---|
| CN | 106168996 A | 11/2016 |
| CN | 109446586 A | 3/2019 |

* cited by examiner

WAVEFORM FILE PROCESSING METHOD, STORAGE MEDIUM, AND DEVICE

CROSS REFERENCE TO RELATED APPLICATION

This application claims priority benefit of Chinese Patent Application No. 202111456118.1, filed on Dec. 2, 2021, and the entire contents of which are incorporated herein by reference.

TECHNICAL FIELD

The present invention relates to a waveform file processing method, storage medium, and device.

BACKGROUND

SoC is the abbreviation of "System on Chip", which means a chip-level system. When the "Chip" is involved, SoC also reflects the relationship and difference between "integrated circuit" and "chip", and the related aspects include integrated circuit design, system integration, chip design, production, encapsulation, testing, etc. Although similar to the definition of "Chip", SoC emphasizes more on an integral whole. In the field of integrated circuits, the definition of SoC is a system or product formed by combining multiple integrated circuits with specific functions on a chip, wherein a complete hardware system and embedded software carried on it are included. This means that on a single chip, the function of an electronic system can be completed, and the said system used to need one or more circuit boards and various kinds of electronic devices, chips, and interconnecting wires on the boards to complete the function. SoC puts more emphasis on the integration of processors (including CPU and DSP), memory, various kinds of interface control modules, and various interconnecting buses. The typical representative of SoC is the mobile phone chip.

The basic content of the definition of SoC mainly involves two aspects: composition and formation process. SoC may be composed of SoC control logic module, microprocessor/microcontroller CPU kernel module, digital signal processor DSP module, embedded memory module, interface module for external communication, analog front-end module containing ADC/DAC, and power supply and power management module. For a wireless SoC, SoC also includes an RF front-end module, a user-defined logic (which can be realized by FPGA or ASIC), and a micro-electromechanical module. More importantly, SoC is embedded with basic software (RDOS or COS and other application software) module or loadable customer software. The formation or generation process of SoC involves the following three aspects: 1) hardware-software co-design and verification based on a monolithic integrated system; 2) use of logical area counting and effective improvement of capacity proportion, i.e. development and research of IP nucleus formation and multiplex techniques, especially reuse of high-capacity memory module embedding; and 3) design theory and technology of very-deep-submicron (VDSM) and nanometer integrated circuits.

As the scale of SoC becomes larger and larger, more and more transistors are integrated into the chip, and the simulation scale of software and hardware simulation tools also grows exponentially. Since the waveform file is the main simulation output result and debugging target of SoC, the size of the waveform file is also increasing (hundreds of GB or TB). The main shortcomings are as follows:

(1) The current waveform tools only support local storage, loading, and debugging. If the waveform file is huge (TB level), extra storage capacity and copy time are needed, thus increasing the debugging cost. (2) The current waveform tools have various problems with large waveform files, a rather low loading speed, and no caching function. (3) The current waveform debugging method only support the debugging of waveform file after the simulation, so the waveform content generated during the simulation cannot be viewed in a real-time manner.

SUMMARY

The objectives of the present invention are to overcome the shortcomings of the prior art and provide a waveform file processing method, storage medium, and device.

The following technical solutions are proposed to achieve the objectives of the present invention:

As the first aspect, the present invention provides a waveform file processing method, wherein the method comprises a storage step, and such storage step comprises the following sub-steps:

Obtain a waveform file that comprises at least one waveform signal;

Assign a basic index value based on the waveform signal, and adopt the variable-length encoding method to, in a memory, encode the said waveform file as a resolvable serialized structure;

When the memory consumed by the serialized structure reaches the threshold, trigger the compression and persistence for the current serialized structure, and obtain the waveform processing file.

Further, the said waveform signal comprises several time-varying waveform signal data, and the index value is a time index. The said basic index value is the basic time of the first waveform signal data, and the index value of any subsequent waveform signal data is an incremental time of the previous waveform signal data.

Further, the said storage step comprises the following sub-steps:

When the memory consumed by the serialized structure reaches the threshold, perform the persistence treatment of the index value by the same method used for the waveform signal processing; regard the processed index value as a part of the waveform processing file.

Further, the said adoption of a variable-length encoding method to, in a memory, encode the said waveform file as a resolvable serialized structure comprises the following steps:

Binarize the said waveform signal data;

Judge whether the binarized value has more than seven digits; if the answer is "Yes", exchange the sequence of the first seven digits and the last seven digits;

After the completion of the above operations, add a flag bit of "without subsequent digits" before the last seven-digit value or the only seven-digit value, and add a flag bit of "with subsequent digits" before the first seven-digit value; use the said flag bit of "with subsequent digits" for the continuous reading of the waveform signal data with more than seven digits in the binarized value;

Obtain the resolvable serialized structure that will convert the waveform signal data into 8 bits or 16 bits.

Further, the said storage step comprises the following sub-steps:

Store the said persisted waveform processing file locally or remotely.

Further, the said waveform processing file comprises:

Head segment: the head of the waveform processing file, including magic number, big-endian/little-endian information, Config segment size, and authentication value;

Config segment: the main parameter segment of the whole waveform file, including the number of waveforms, starting position, size, and compression algorithm type;

Data segment: waveform data segment that has been re-encoded and compressed;

Index segment: the waveform signal name and the position index value of the waveform data corresponding to the name.

Further, the said method further comprises a waveform file access step after the said storage step, and the said waveform file access step comprises the following sub-steps:

Obtain an index structure of the waveform processing file, and select a corresponding waveform signal according to other parameters and conditions in the waveform processing file;

Decode the waveform processing file by the decoding method corresponding to the encoding method, and display the waveform signal.

Further, the said method further comprises a waveform file comparison step after the said storage step, and the said waveform file comparison step comprises the following sub-steps:

Obtain an index structure of the waveform processing file, and select two waveform signals according to other parameters and conditions in the waveform processing file;

Compare the said two waveform signals.

As the second aspect of the present invention, the present invention provides a storage medium storing computer instructions, and during the running of the said computer instructions, the steps of one of the said waveform file processing methods are executed.

As the third aspect, the present invention provides a device consisting of a memory and a processor, the said memory stores the computer instructions that can be run in the said processor, and when the processor runs the said computer instructions, the steps of one of the said waveform file processing methods are executed.

The present invention has the following beneficial effects:

(1) In an exemplary embodiment of the present invention, based on the simulation signals of waveform files of other existing formats, simulation tools, or other third-party tools, after an index value is assigned based on the signal, it is encoded into a resolvable serialized structure. The said structure is stored in memory to increase the signal data processing speed and continuously add the newly generated signal change values in sequence. In addition, the present invention uses a unique organization mode to locally or remotely generate a waveform file of a specific format, so that the efficiency of subsequent storage, reading, and debugging based on a waveform database file of the said format is significantly improved. Meanwhile, compared with the current overseas monopolistic format standards of waveform files in the industry, the file size is reduced by more than 10 times, the access efficiency is improved by 10 times, and the larger the waveform file is, the more obvious the advantages are.

(2) In another exemplary embodiment of the present invention, similar to waveform data, all waveform signal index values (time axes) are also separately stored as independent serialized structures in a variable encoding manner. Since the variable-length algorithm is to represent the data changing in a certain range by the bytes with different lengths. That is, the data with smaller values are represented by shorter bytes, while the data with larger values or the rather complex data are represented by longer bytes. Compared with the fixed-length encoding that uses the bytes with the length required by the maximum value to represent the data, this encoding scheme can usually effectively reduce the data storage space. In addition, the said basic index value is the basic time of the first waveform signal data, and the index value of any subsequent waveform signal data is an incremental time of the previous waveform signal data. Therefore, the index value corresponding to each waveform signal data is a small value. As a result, the variable-length encoding can further reduce the data storage space required by this content.

(3) In another exemplary embodiment of the present invention, the specific steps for adopting the variable-length encoding method to, in a memory, encode the said waveform file as a resolvable serialized structure are disclosed, which have the advantages of (1) effectively reducing the storage space of waveform data and (2) increasing the reading speed of waveform data.

(4) In another exemplary embodiment of the present invention, the persisted waveform processing file may be directly stored locally to facilitate subsequent processing or stored remotely (such as in a cloud or server) to make it convenient for multiple local terminals to view the file simultaneously. In another exemplary embodiment, the server-browser mode is adopted for the storage and reading of the waveform signals, thus increasing the waveform storage speed, directly improving the simulation speed of the chip, greatly reducing the debugging cost of huge waveform files, and ensuring the consistency of waveform files.

(5) In another exemplary embodiment of this present invention, since the same serialized structure (waveform processing file) may include the content of multiple waveform signals, or the composition of multiple serialized structures (waveform processing files) only includes the content of one waveform signal, the explanation needs to be provided in the waveform processing files.

(6) In another exemplary embodiment of the present invention, the waveform viewer initiates a request to view a local or remote waveform file (i.e. open the waveform file and specify the file or signal content to be viewed), obtains the parameter configuration structure and the general index data structure of the waveform file, and sets the query conditions to view, debug, and operate the waveform file according to the needs. Different from the traditional waveform viewing software, in this process, the waveform viewer only reads useful information, instead of all the waveform file data, from the waveform file to the memory cache. In addition, the waveform viewer keeps the consistency of remote and local access interfaces during the reading of the waveform file, that is, the users cannot use the operating mode to detect whether the waveform file is stored locally or remotely. Meanwhile, the caching of the first access signal and the Least Recently Used (LRU) replacement strategy are used to increase the reading speed of waveform data.

(7) In another exemplary embodiment of the present invention, the comparison of waveform files may also be included. That is, during the chip design verification, the target waveform file is set as a Golden file, and the debugging goal of the engineer is to debug the current design to output the conforming Golden waveform signals, so the waveform data after each simulation shall be compared with the target Golden waveform. In addition, the management and simulation of waveform files debug the interaction between the waveform file and Golden. According to the organization mode of waveform data, conditions such as specific waveform signal, time range, and trigger information can be set. This can ensure the consistency of Golden files and reduce the times of copy and moving of files.

In another exemplary embodiment of the present invention, the storage medium and device also include the same advantages.

DETAILED DESCRIPTION OF THE PREFERRED EMBODIMENTS

The technical solutions of the present invention will be clearly and completely described in conjunction with the drawings. Apparently, the embodiments described below are part, not all, of the embodiments of the present invention. All other embodiments obtained by those skilled in the art based on the embodiments of the present invention without creative efforts shall fall within the protection scope of the present invention.

It should be noted that the directions or position relationships such as "central", "upper", "lower", "left", "right", "vertical", "horizontal", "inside", and "outside" in the description of the present invention are based on those on drawings, and are used only for facilitating the description of the present invention and for simplified description, not for indicating or implying that the target devices or components must have a special direction and be structured and operated at the special direction, therefore, they cannot be understood as the restrictions to the present invention.

It should be noted in the description of the present invention that unless otherwise specified or restricted, the words "installation", "interconnection", and "connection" shall be understood in a general sense. For example, the connection may be a fixed connection, removable connection, integrated connection, mechanical connection, electrical connection, direct connection, indirect connection through intermediate media, or connection between two components. Those skilled in the art can understand the specific meanings of the terms above in the present invention as the case may be.

The terms used in the present application are for the sole purpose of describing particular embodiments and are not intended to limit the present application. The singular forms such as "one kind" "the said +singular noun" and "such +singular noun" used in the present application and the appended claims also include the plural forms, unless otherwise clearly indicated in the context. It should also be understood that the term "and/or" used herein refers to and includes any or all possible combinations of one or more relevant listed items.

It should be understood that the information should not be limited by "first", "second", "third", and other similar terms which are used in the present application to describe such information. These terms are only used to distinguish the same type of information from each other. For example, in the present application, the first information may also be referred to as the second information, and vice versa. Besides, the word "if" as used herein may, depending on the context, be interpreted as "while", "when", or "responding to a determination". Moreover, the words "first" and "second" are used only for description, and cannot be understood as an indication or implication of relative importance.

Moreover, the technical characteristics involved in different embodiments of the present invention as described below can be combined together provided there is no discrepancy among them.

First, the words are explained as follows:

SoC is the abbreviation of "System on Chip", which means a chip-level system. In the field of integrated circuits, the definition of SoC is a system or product formed by combining multiple integrated circuits with specific functions on a chip, wherein a complete hardware system and embedded software carried on it are included. This means that on a single chip, the function of an electronic system can be completed, and the said system used to need one or more circuit boards and various kinds of electronic devices, chips, and interconnecting wires on the boards to complete the function.

Software and hardware simulation:

(1) Software simulation: Software simulation mainly uses computer software to simulate the operation, so the simulation of a system irrelevant to hardware has certain advantages. The users can verify the program without building hardware circuits, which is especially suitable for algorithms-oriented programs. The disadvantage of software simulation is that it cannot completely simulate the parts related to hardware, so it is necessary to use hardware simulation to complete the final design.

(2) Hardware simulation: Hardware simulation uses additional hardware to replace the single-chip microcomputer in the user's system and complete all or most of the functions of the single-chip microcomputer. The user can use the additional hardware to control the running of the program such as single-step, full speed, and resource breakpoint viewing. Hardware simulation is necessary for development.

Waveform file: The waveform file is the main simulation output result and debugging target of the SoC and may comprise the waveform files generated by simulation tools (such as emulator, simulator, or virtual prototype) or other format waveform files (such as VCD files).

In the prior art, as the scale of SoC becomes larger and larger, more and more transistors are integrated into the chip. Since the simulation scale of software and hardware simulation tools also grows exponentially, the size of the waveform file is also increasing (hundreds of GB or TB). Therefore, there are the following problems: (1) The current waveform tools only support local storage, loading, and debugging. If the waveform file is huge (TB level), extra storage capacity and copy time are needed, thus increasing the debugging cost. (2) The current waveform tools have various problems with large waveform files, a rather low loading speed, and no caching function. (3) The current waveform debugging method only support the debugging of waveform file after the simulation, so the waveform content generated during the simulation cannot be viewed in a real-time manner.

Figure 1:
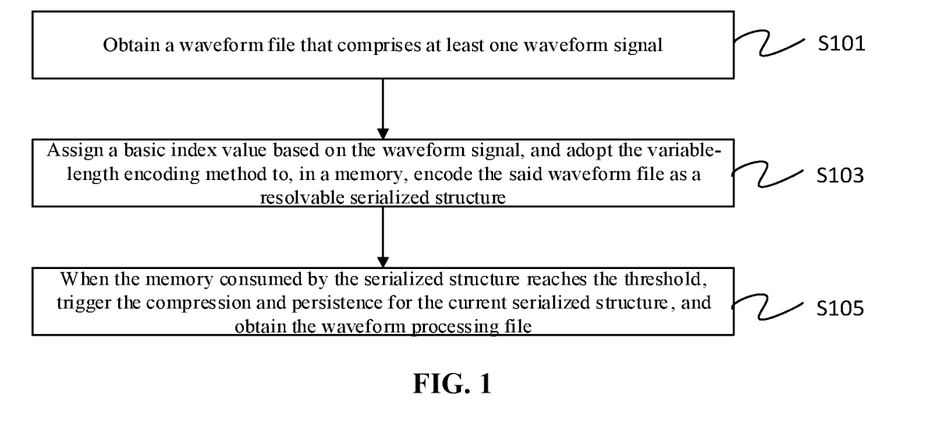
FIG. 1 is the flow diagram of a waveform file processing method provided by an exemplary embodiment of the present invention.

Refer to FIG. 1. As the first aspect, the present invention provides a waveform file processing method, wherein the method comprises a storage step, and such storage step comprises the following sub-steps:

S101: Obtain a waveform file that comprises at least one waveform signal;

S103: Assign a basic index value based on the waveform signal, and adopt the variable-length encoding method to, in a memory, encode the said waveform file as a resolvable serialized structure;

S105: When the memory consumed by the serialized structure reaches the threshold, trigger the compression and persistence for the current serialized structure, and obtain the waveform processing file.

In step S101, the said waveform files may be generated by a simulation tool (such as emulator, simulator, and virtual prototype) or other format waveform files (such as VCD files). In addition, the waveform file can be obtained locally or remotely. That is, the data of waveform signals changing with time can be transmitted through network communication to other storage hosts for the subsequent waveform data processing process. Therefore, in this exemplary embodiment, the server-browser mode is adopted for the storage and reading of the waveform signals, thus increasing the waveform storage speed, directly improving the simulation speed of the chip, greatly reducing the debugging cost of huge waveform files, and ensuring the consistency of waveform files.

In step S103, after an index value is assigned based on the signal, it is encoded into a resolvable serialized structure. The said structure is stored in memory to increase the signal data processing speed and continuously add the newly generated signal change values in sequence. More specifically, the variable-length encoding method is used for the waveform data. The variable-length encoding algorithm is to represent the data changing in a certain range by the bytes with different lengths. That is, the data with smaller values are represented by shorter bytes, while the data with larger values or the rather complex data are represented by longer bytes. Compared with the fixed-length encoding that uses the bytes with the length required by the maximum value to represent the data, this encoding scheme can usually effectively reduce the data storage space.

In step S105, the optional lossless data compression algorithm such as LZ4 and ZSTD is adopted. At the same time, the compression algorithm type to be adopted for the next data segment is indicated in the Config segment of the waveform file. In view of the difference between the fast decompression speed of LZ4 and the high compression rate of ZSTD, the user can make a trade-off during reuse. According to the setting of the memory threshold used, when the memory used reaches the threshold, the persistence of the current serialized waveform signal data is triggered (that is, the data are kept in a nonvolatile memory bank, such as a disk or SSD). After all the structures are serialized, the data are compressed by lossless compression algorithms (such as LZ4 and ZSTD) before persistence.

Figure 2:
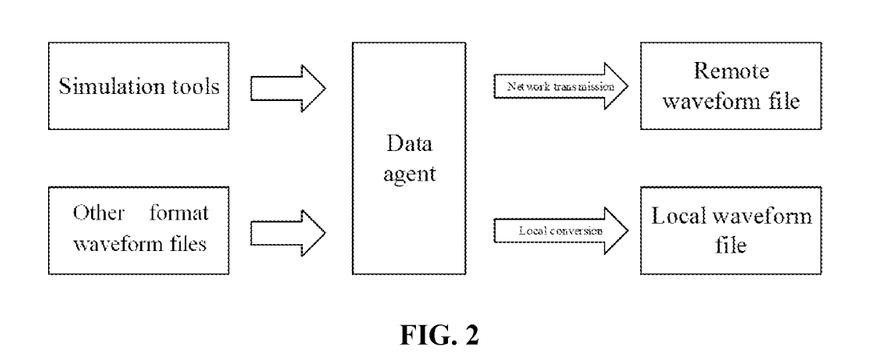
FIG. 2 is the flow diagram of the local or remote generation of a waveform file of a specific format in a waveform file processing method provided by an exemplary embodiment of the present invention.

Therefore, in this exemplary embodiment, on the basis of simulation signals of simulation tools, other third-party tools, or existing waveform files of other formats, a unique organization mode is used to locally or remotely generate a waveform file of a specific format (as illustrated in FIG. 2) so that the efficiency of subsequent storage, reading, and debugging based on the waveform database file of the said format is significantly improved. Meanwhile, compared with the current overseas monopolistic format standards of waveform files in the industry, the file size is reduced by more than 10 times, the access efficiency is improved by 10 times, and the larger the waveform file is, the more obvious the advantages are.

Preferably, in an exemplary embodiment, the said waveform signal comprises several time-varying waveform signal data, and the index value is a time index. The said basic index value is the basic time of the first waveform signal data, and the index value of any subsequent waveform signal data is an incremental time of the previous waveform signal data.

Specifically, in this exemplary embodiment, the waveform signal is further defined as a time-varying waveform signal data, and the index value is a time index. That is, the step S103 is replaced as follows:

S103': For the time-varying signal data, after an index value is assigned based on the signal by a variable-length encoding method, it is encoded into a resolvable serialized structure, wherein the said structure is stored in memory to increase the signal data processing speed and continuously add the newly generated signal change values over time.

Preferably, in an exemplary embodiment, the said storage step also comprises the following sub-steps:

S106: When the memory consumed by the serialized structure reaches the threshold, perform the persistence treatment of the index value by the same method used for the waveform signal processing; regard the processed index value as a part of the waveform processing file.

Specifically, in this exemplary embodiment, similar to waveform data, all waveform signal index values (time axes) are also separately stored as independent serialized structures in a variable encoding manner. Since the variable-length algorithm is to represent the data changing in a certain range by the bytes with different lengths. That is, the data with smaller values are represented by shorter bytes, while the data with larger values or the rather complex data are represented by longer bytes. Compared with the fixed-length encoding that uses the bytes with the length required by the maximum value to represent the data, this encoding scheme can usually effectively reduce the data storage space.

In addition, the said basic index value is the basic time of the first waveform signal data, and the index value of any subsequent waveform signal data is an incremental time of the previous waveform signal data. Therefore, the index value corresponding to each waveform signal data is a small value (for example, 1). As a result, the variable-length encoding can further reduce the data storage space required by this content.

Preferably, in an exemplary embodiment, the said adoption of a variable-length encoding method to, in a memory, encode the said waveform file as a resolvable serialized structure comprises the following steps:

S10301: Binarize the said waveform signal data;

S10303: Judge whether the binarized value has more than seven digits; if the answer is "Yes", exchange the sequence of the first seven digits and the last seven digits; (meeting the requirements for byte order)

S10305: After the completion of the above operations, add a flag bit of "without subsequent digits" before the last seven-digit value or the only seven-digit value, and add a flag bit of "with subsequent digits" before the first seven-digit value; use the said flag bit of "with subsequent digits" for the continuous reading of the waveform signal data with more than seven digits in the binarized value;

S10307: Obtain the resolvable serialized structure that will convert the waveform signal data into 8 bits or 16 bits.

Specifically, in this exemplary embodiment, the first bit of each byte is used to identify whether it is necessary to continue backward reading. The lower 7 bits of each byte are used for actual encoding, so any value between 0 and 127 can be represented by one byte. When the value is beyond the range of value that can be represented by the said 7 bits of the byte, one byte will be read backward.

The encoding process of waveform signal data (for example, "300") is as follows:

S10301': Binarize the waveform signal data "300", the result of which is "1 0010 1100" (256+32+8+4=300);

S10303': Judge whether the binarized value ("1 0010 1100") has more than seven digits; since the answer is "Yes", exchange the order of the first seven digits and the last seven digits, after which the byte order is "010 1100 000 0010";

S10305: After the completion of the above operations, add a flag bit of "without subsequent digits" before the last seven-digit value or the only seven-digit value, and add a flag bit of "with subsequent digits" before the first seven-digit value; use the said flag bit of "with subsequent digits" for the continuous reading of the waveform signal data with more than seven digits in the binarized value; that is, after a flag bit is added for "010 1100 000 0010", the serialized structure "1010 1100 0000 0010" is obtained;

S10307: Obtain the resolvable serialized structure that will convert the waveform signal data into 8 bits or 16 bits, i.e. "1010 1100 0000 0010".

Similarly, the corresponding decoding process is as follows: Read a byte first and, if the first bit of the high order of the byte is 1, continue the reading; if 0, stop the reading. Remove the first bit of each byte and invert the remaining bit packets to obtain the original data.

For example (represent by Little-Endian byte order):

The serialization of 300 by the latter method is 1010 1100 0000 0010. The operation process is as follows:

1010 1100 0000 0010->010 1100 000 0010 (remove the flag bit)->000 0010 010 1100 (adjust the byte order)->1 0010 1100->256+32+8+4=300 (calculated value).

Specifically, the present application uses this method to form a resolvable serialized structure. As shown in the above example, the stored value only needs two-byte spaces (16 bits) and can store a value of any size. However, the traditional method defines that the short int requires two bytes and has a storage range of −32768~32767, and that the int requires four bytes and has a storage range of −2147483648~2147483647. Generally, a waveform data value has a certain range of fluctuation features, so this method can realize the storage flexibility and reduce the data space.

Figure 3:
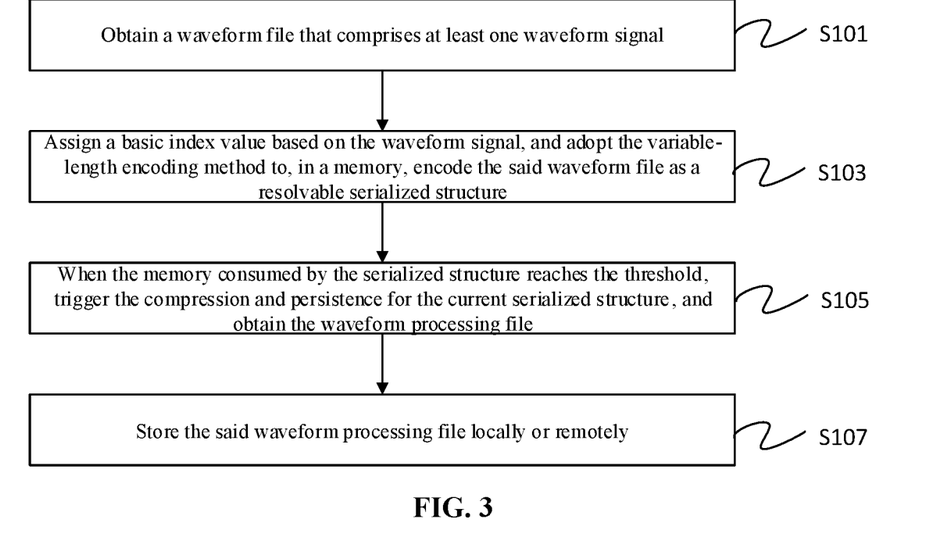
FIG. 3 is the flow diagram of a waveform file processing method provided by another exemplary embodiment of the present invention.

Preferably, in an exemplary embodiment, as illustrated in FIG. 3, the said storage step also comprises the following sub-steps:

S107: Store the said persisted waveform processing file locally or remotely.

Specifically, in this exemplary embodiment, the persisted waveform processing file may be directly stored locally to facilitate subsequent processing or stored remotely (such as in a cloud or server) to make it convenient for multiple local terminals to view the file simultaneously.

Figure 4:
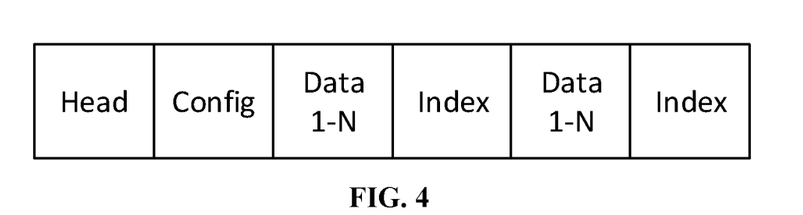
FIG. 4 is the structural diagram of a waveform processing file provided by an exemplary embodiment of the present invention.

Preferably, in an exemplary embodiment, as illustrated in FIG. 4, the said waveform processing file comprises:

Head segment: the head of the waveform processing file with a fixed size, including magic number, big-endian/little-endian information, Config segment size, and authentication value;

Config segment: the main parameter segment of the whole waveform file, including the number of waveforms, starting position, size, and compression algorithm type;

Data segment: waveform data segment that has been re-encoded and compressed;

Index segment: the waveform signal name and the position index value of the waveform data corresponding to the name.

Specifically, since the same serialized structure (waveform processing file) may include the content of multiple waveform signals, or the composition of multiple serialized structures (waveform processing files) only includes the content of one waveform signal, the explanation needs to be provided in the waveform processing files. Therefore, in this exemplary embodiment:

The specific meanings of the parameters included in a Head segment are as follows: Magic number refers to a fixed value that quickly identifies a file belonging to a waveform file of a specific format; in this exemplary embodiment, the magic number is "YWS!". Big-endian/little-endian information refers to the method for representing the byte order. Config segment size refers to the byte size representing the Config segment. Authentication value is the hash value to authenticate the Head segment and the Config segment to prevent the tampering of segment data.

The specific meanings of the parameters included in a Config segment are as follows: Number of waveforms refers to the number of waveforms in the whole serialized structure (which is the same as the number of Data 1-N and index in FIG. 2). The starting position refers to the starting position of a certain segment of waveform data stored in the file. Size refers to the final storage byte length of a certain waveform data. The compression algorithm type refers to the optional lossless data compression algorithm such as LZ4 and ZSTD before the persistence to facilitate the subsequent decompression;

The specific meanings of the parameters included in multiple Data segments are as follows: Waveform data segment that has been re-encoded and compressed refers to "the said serialized structure" that is obtained by 5105;

The specific meanings of the parameters included in multiple Index segments are as follows: Waveform signal name refers to the name of the waveform signal that is obtained by the sub-step "Obtain a waveform file" in step S101. The position index value of the waveform data corresponding to the name at least includes the basic index value in step 103 and preferably also comprises the time index value in step 103' or step 106.

Figure 5:
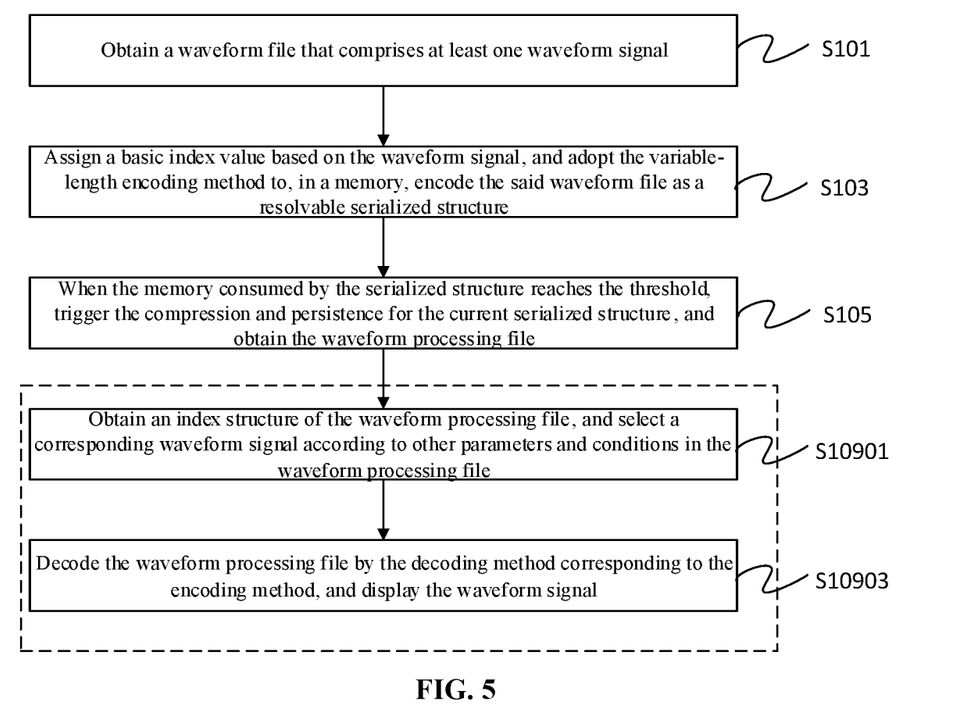
FIG. 5 is the flow diagram of a waveform file processing method provided by another exemplary embodiment of the present invention.

Preferably, in an exemplary embodiment, the said method also comprises the waveform file access step S109 after the storage step, as illustrated in FIG. 5, and the said waveform file access step comprises the following sub-steps:

S10901: Obtain an index structure of the waveform processing file, and select a corresponding waveform signal according to other parameters and conditions in the waveform processing file;

S10903: Decode the waveform processing file by the decoding method corresponding to the encoding method, and display the waveform signal.

Figure 6:
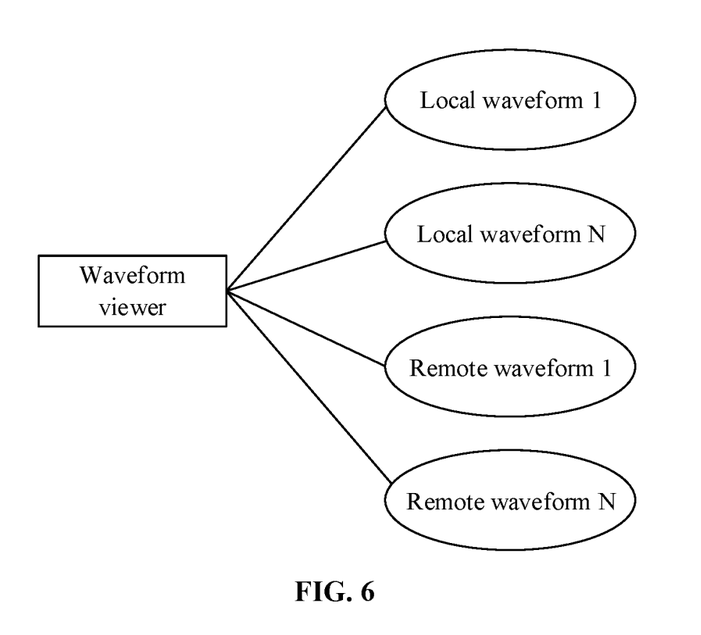
FIG. 6 is a schematic diagram of the initiation of a request to view a local or remote waveform file by a waveform viewer in a waveform file processing method provided in an exemplary embodiment of the present invention.

Specifically, in this exemplary embodiment, the index structure (time index) of the waveform processing file may be obtained in the waveform viewer and other parameters (such as waveform name) may be obtained for display. That is, as illustrated in FIG. 6, the waveform viewer initiates a request to view a local or remote waveform file (i.e. open the waveform file and specify the file or signal content to be viewed), obtains the parameter configuration structure and the general index data structure of the waveform file, and sets the query conditions to view, debug, and operate the waveform file according to the needs. In the initial request process, the waveform viewer may receive a small amount of re-encoded and compressed parameter data and index data to analyze the overall information of the waveform file, thus quickly opening the waveform file. Later, only the waveform data that the user needs to view are requested through the local or network operation interface, and the real waveform information is displayed by decompression and re-encoding locally in the waveform viewer.

When the waveform processing file structure as illustrated in FIG. 3 is adopted, first read the content of the Head segment to verify whether the magic number is correct, and verify the Head segment and the Config segment by the hashing verification value; use the Config segment (number of waveforms, starting position, size, general index data segment, and compression algorithm type) to obtain the basic information of the waveform file, and set the query or operation conditions of the waveform signal according to the basic information for secondary access; use the index information to obtain the overall distribution structure of the waveform data segment, and read the Data segment information.

Figure 7:
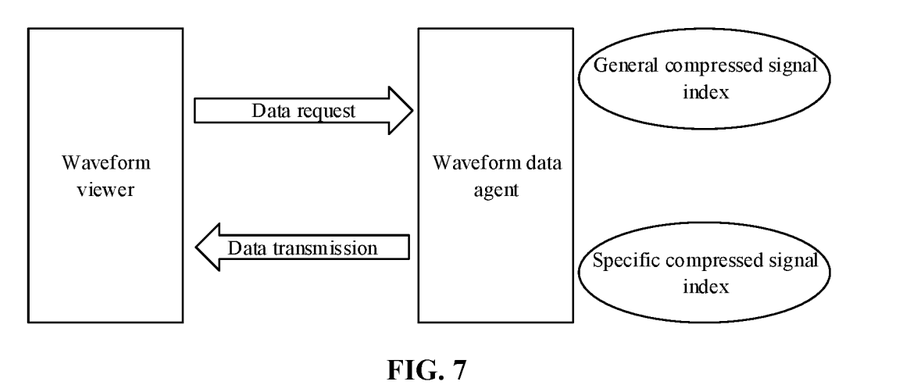
FIG. 7 is the schematic diagram of the access of a waveform processing file of a waveform file provided by another exemplary embodiment of the present invention.

In addition, in this exemplary embodiment, as illustrated in FIG. 7, the access of the waveform file keeps the consistency of remote and local access interfaces during the reading of the waveform file, that is, the users cannot use the operating mode to detect whether the waveform file is stored locally or remotely. Meanwhile, the caching of the first access signal and the Least Recently Used (LRU) replacement strategy are used to increase the reading speed of waveform data.

Specifically, caching methods include local caching of the waveform viewer and remote caching of the waveform server. Local caching of the waveform viewer refers that the original data of the waveform signal viewed by the waveform viewer will be first cached in the local memory and operate this signal in the local memory, instead of re-reading the waveform data in the waveform file. Only when the waveform signal is Not Hit in the local memory will the file reading operation be performed. Remote caching of the waveform server refers that the waveform file server receives the waveform data requested remotely by the waveform viewer, caches the waveform data in the memory of the remote server, and makes a query in the server memory first for each waveform signal request. Only when the result is Not Hit will the waveform server read the waveform file in the disk.

Here, the index value of each waveform signal is used as a Key, and the signal data are used as a Key Value. When the space consumed by the Key Value pairs in the memory is too large and exceeds a certain threshold, the cache elimination strategy will be initiated. When it is necessary to eliminate the Key Value pairs in the cache, the main purpose is to eliminate the Key Value pairs that will not be used again or will be less used, and retain the Key Values that will be frequently accessed. The LRU strategy indicates the Key Values that are recently accessed frequently and will also be accessed more likely in the future. Since some Key Value pairs in the cache have most of the access, when the access mode rarely changes, the last access time of each Key Value pair can be recorded, and the Key Value pair with the least idle time may be considered as the Key Value pair that will be most likely accessed in the future. After the use of the LRU strategy, the reading frequency of waveform files in the disk may be effectively reduced and the waveform access speed may be increased.

Figure 8:
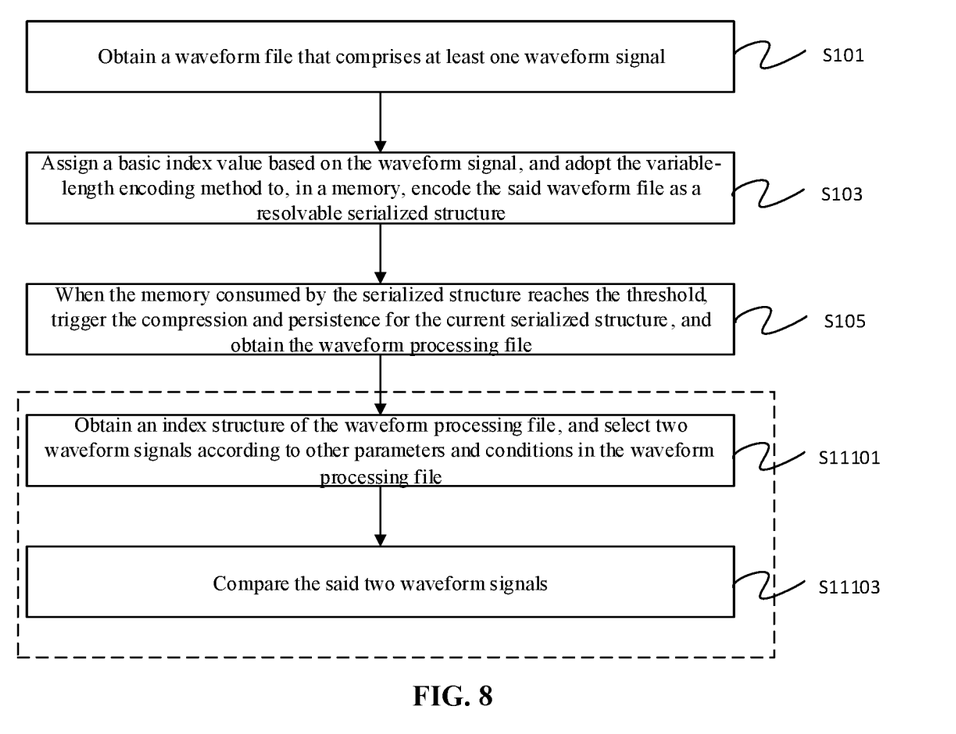
FIG. 8 is the flow diagram of a waveform file processing method provided by another exemplary embodiment of the present invention.

Preferably, in an exemplary embodiment, the said method also comprises the waveform file comparison step S111 after the storage step, as illustrated in FIG. 8, and the said waveform file comparison step comprises the following sub-steps:

S11101: Obtain an index structure of the waveform processing file, and select two waveform signals according to other parameters and conditions in the waveform processing file;

S11103: Compare the said two waveform signals.

Figure 9:
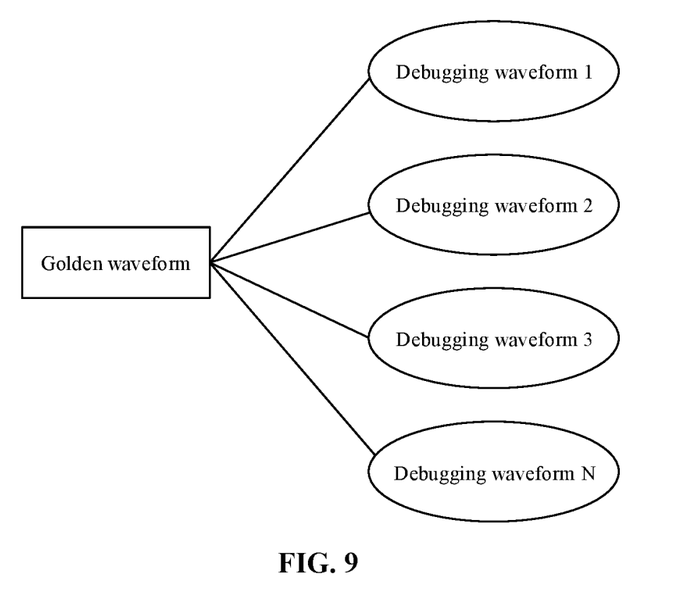
FIG. 9 is the schematic diagram of the comparison of a waveform processing file of a waveform file provided by another exemplary embodiment of the present invention.

Specifically, in this exemplary embodiment, the waveform file comparison includes that the management and simulation of waveform files debug the interaction between the waveform file and Golden. During the chip design verification, the target waveform file is set as a Golden file, the debugging goal of the chip verification engineer is to debug the current design to output the conforming Golden waveform signals, so the waveform data after each simulation shall be compared with the target Golden waveform. In addition, the management and simulation of waveform files debug the interaction between the waveform file and Golden. According to the organization mode of waveform data, the comparison between local and remote waveform files may be realized. The main framework is illustrated in FIG. 9. According to the organization mode of waveform data, conditions such as specific waveform signal, time range, and trigger information can be set. For example, the Clock signals in the local waveform file and the remote Golden waveform file are compared within the initial time range of 0-100 ns. At the same time, the trigger condition to stop the comparison may be set as the appearance of the first difference of the Clock signal, thus reducing the time to return the results. This will avoid copying huge waveform files to the local memory or confusing the Golden file in practice to ensure the consistency of Golden files and reduce the number of file moves.

Different from the traditional way that can only read the waveform file as a whole and compare the signals one by one, in this exemplary embodiment, during the comparison between the waveform file and the Golden file, on the premise that the re-encoding and compression are performed in advance to obtain a smaller waveform file, the index method may be used to extract certain waveform signal data that needs to be compared, the waveform data segments are compared first, and the specific signal values in the segments are compared later, thus achieving the effect of quickly obtaining the comparison results.

With the same inventive concept as the above-mentioned exemplary embodiment, another exemplary embodiment of the present invention provides a storage medium storing computer instructions, and during the running of the said computer instructions, the steps of one of the said waveform file processing methods are executed.

With the same inventive concept as the above-mentioned exemplary embodiment, another exemplary embodiment of the present invention provides a device consisting of a memory and a processor, the said memory stores the computer instructions that can be run in the said processor, and when the processor runs the said computer instructions, the steps of one of the said waveform file processing methods are executed.

Based on such an understanding, the technical solution of this embodiment or the part that contributes to the prior art or the part of the technical solution can be embodied in the form of a software product, which is stored in a storage medium and includes several instructions causing a computer device (which can be a personal computer, a server, or a network device) to execute all or part of the steps of the method described in each embodiment of the present invention.

The memory is used to store various types of data to support the operation of the device. The said data may, for example, include the instructions for any application or method used to operate the device and the application-related data such as contact data, sent and received messages, pictures, audios, and videos. The memory can be any type of volatile memory device, nonvolatile memory device, or their combination, such as Static Random Access Memory (SRAM), Electrically Erasable Programmable Read-Only Memory (EEPROM), Erasable Programmable Read-Only Memory (EPROM), Programmable Read-Only Memory (PROM), Read-Only Memory (ROM), magnetic memory, flash memory, magnetic disk, or optical disk.

Obviously, the embodiments above are only examples for clear descriptions, not the restrictions on the mode of embodiments. Those skilled in the art can also make other changes in different forms on the basis of the descriptions above. It is neither necessary nor possible to exhaustively list each embodiment. The obvious change arising from the embodiments above is still in the scope of protection by the present invention.

What is claimed is:

1. A waveform file processing method, which is characterized in that it comprises a storage step, and the said storage step comprises the following sub-steps:
    Obtain a waveform file that comprises at least one waveform signal;
    Assign a basic index value based on the waveform signal, and adopt the variable-length encoding method to, in a memory, encode the said waveform file as a resolvable serialized structure;
    When the memory consumed by the serialized structure reaches a threshold, trigger the compression and persistence for the current serialized structure, and obtain the waveform processing file;
    The said waveform signal comprises several time-varying waveform signal data, and the index value is a time index;
    The said basic index value is the basic time of the first waveform signal data, and the index value of any subsequent waveform signal data is an incremental time of the previous waveform signal data.

2. The waveform file processing method according to claim 1, which is characterized in that the said storage step further comprises the following sub-steps:
    When the memory consumed by the serialized structure reaches the threshold, perform the persistence treatment of the index value by the same method used for the waveform signal processing; regard the processed index value as a part of the waveform processing file.

3. The waveform file processing method according to claim 1, which is characterized in that the adoption of a variable-length encoding method to, in a memory, encode the said waveform file as a resolvable serialized structure comprises the following steps:
    Binarize the said waveform signal data;
    Judge whether the binarized value has more than seven digits; if the answer is "Yes", exchange the sequence of the first seven digits and the last seven digits;
    After the completion of the above operations, add a flag bit of "without subsequent digits" before the last seven-digit value or the only seven-digit value, and add a flag bit of "with subsequent digits" before the first seven-digit value; use the said flag bit of "with subsequent digits" for the continuous reading of the waveform signal data with more than seven digits in the binarized value;
    Obtain the resolvable serialized structure that will convert the waveform signal data into 8 bits or 16 bits.

4. The waveform file processing method according to claim 1, which is characterized in that the said storage step further comprises the following sub-steps:
    Store the said persisted waveform processing file locally or remotely.

5. The waveform file processing method according to claim 1, which is characterized in that the said waveform processing file comprises:
    Head segment: the head of the waveform processing file, including magic number, big-endian/little-endian information, Config segment size, and authentication value;
    Config segment: including the number of waveforms, starting position, size, and compression algorithm type;
    Data segment: waveform data segment that has been re-encoded and compressed;
    Index segment: the waveform signal name and the position index value of the waveform data corresponding to the name.

6. The waveform file processing method according to claim 1, which is characterized in that the said method further comprises a waveform file access step after the said storage step, and the said waveform file access step comprises the following sub-steps:
    Obtain an index structure of the waveform processing file, and select a corresponding waveform signal according to other parameters and conditions in the waveform processing file;
    Decode the waveform processing file by the decoding method corresponding to the encoding method, and display the waveform signal.

7. The waveform file processing method according to claim 1, which is characterized in that the said method further comprises a waveform file comparison step after the said storage step, and the said waveform file comparison step comprises the following sub-steps:
    Obtain an index structure of the waveform processing file, and select two waveform signals according to other parameters and conditions in the waveform processing file;
    Compare the said two waveform signals.

* * * * *